(12) United States Patent
Tsubomi

(10) Patent No.: US 12,238,924 B2
(45) Date of Patent: Feb. 25, 2025

(54) SEMICONDUCTOR DEVICE HAVING STI REGION

(71) Applicant: MICRON TECHNOLOGY, INC., Boise, ID (US)

(72) Inventor: Kunihiro Tsubomi, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 258 days.

(21) Appl. No.: 17/202,146

(22) Filed: Mar. 15, 2021

(65) Prior Publication Data

US 2022/0293612 A1 Sep. 15, 2022

(51) Int. Cl.
| | | |
|---|---|---|
| *H10B 12/00* | (2023.01) | |
| *H01L 21/02* | (2006.01) | |
| *H01L 21/3105* | (2006.01) | |
| *H01L 21/311* | (2006.01) | |
| *H01L 21/762* | (2006.01) | |
| *H01L 29/06* | (2006.01) | |

(52) U.S. Cl.
CPC ....... *H10B 12/50* (2023.02); *H01L 21/02164* (2013.01); *H01L 21/0217* (2013.01); *H01L 21/31053* (2013.01); *H01L 21/31116* (2013.01); *H01L 21/76224* (2013.01); *H01L 29/0649* (2013.01); *H10B 12/09* (2023.02)

(58) Field of Classification Search
CPC ......... H01L 27/10897; H01L 21/02164; H01L 21/0217; H01L 21/31053; H01L 21/31116; H01L 21/76224; H01L 27/10894; H01L 29/0649

See application file for complete search history.

(56) References Cited

U.S. PATENT DOCUMENTS

| | | | | |
|---|---|---|---|---|
| 2002/0197823 | A1* | 12/2002 | Yoo ................... | H01L 21/76232 257/E21.549 |
| 2008/0003775 | A1* | 1/2008 | Yamada ............... | C23C 16/401 257/E21.279 |
| 2010/0081266 | A1* | 4/2010 | Mori ..................... | H10B 41/49 257/E21.422 |
| 2021/0376074 | A1* | 12/2021 | Tanaka ............ | H01L 21/823878 |

* cited by examiner

*Primary Examiner* — Monica D Harrison
*Assistant Examiner* — Andre C Stevenson
(74) *Attorney, Agent, or Firm* — Dorsey & Whitney LLP

(57) ABSTRACT

Disclosed herein is an apparatus that includes a semiconductor substrate including first and second circuit regions a first trench extending in a first direction and formed between the first and second circuit regions, wherein the first trench includes a first inner wall positioned on the first circuit region side and a second inner van positioned on the second circuit region side, and a plurality of second trenches extending in a second direction different from the first direction and firmed in the first circuit region such that the second trench communicates with the first trench at the first inner wall; and a first insulating film formed on the first and second inner walls such that the second inner wall is covered with the first insulating film without being exposed.

9 Claims, 20 Drawing Sheets

SEMICONDUCTOR DEVICE HAVING STI REGION

BACKGROUND

In a semiconductor device such as a DRAM (Dynamic Random Access Memory), there is a case where a memory cell array region and a peripheral circuit region are separated by an STI (Shallow Trench Isolation). The STI is filled with an insulating material such as a silicon oxide. It is desirable that a level difference between the surface of the STI formed of the insulating material such as a silicon oxide and the surface of the memory cell array region to be small. Meanwhile, it is preferable that the surface of the STI protrudes from the surface of the peripheral circuit region. The reason is that the top part of an inner wall of the STI positioned on the side of the peripheral circuit region is exposed. A conducting material constituting a wiring pattern is accumulated in the exposed part due to preprocessing for forming a gate dielectric film in the peripheral circuit region if the surface of the STI is not protruded from the surface of the peripheral circuit region.

DETAILED DESCRIPTION

Various embodiments of the present invention will be explained below in detail with reference to the accompanying drawings The following detailed description refers to the accompanying drawings that show, by way of illustration, specific aspects, and embodiments in which the present invention may be practiced. These embodiments are described in sufficient detail to enable those skilled in the art to practice the present invention. Other embodiments may be utilized, and structural, logical, and electrical changes may be made without departing from the scope of the present invention, The various embodiments disclosed herein are not necessary mutually exclusive, as some disclosed embodiments can be combined with one or more other disclosed embodiments to form new embodiments.

Figure 1A:
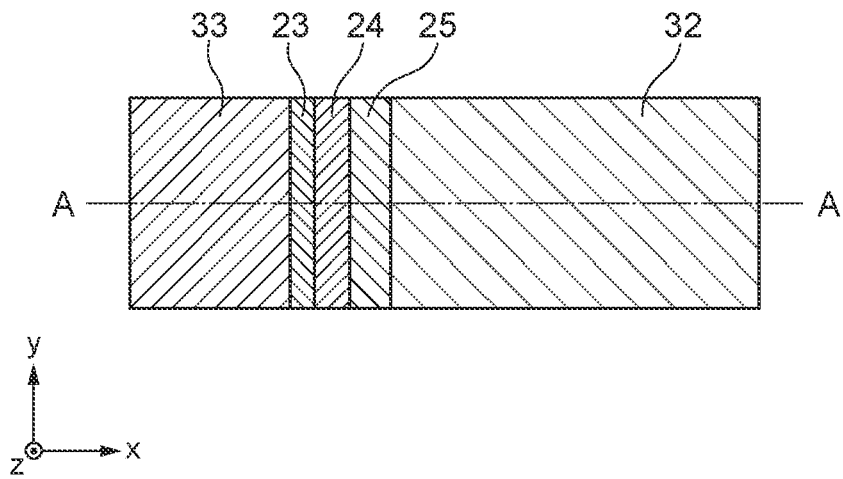
FIG. 1A is a partial schematic plan view of a semiconductor device according to the present disclosure.
Figure 1B:
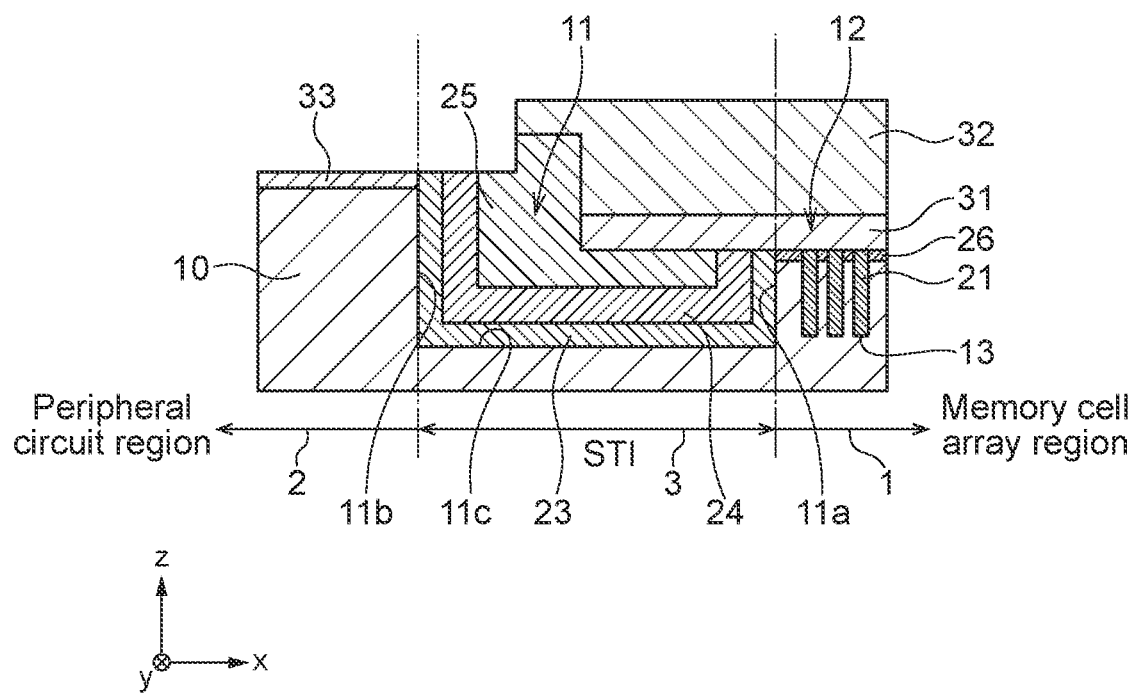
FIG. 1B is a schematic cross-section along a line A-A shown in FIG. 1A.

A semiconductor device according to the present disclosure is a semiconductor memory device such as a DRAM and includes a semiconductor substrate 10 divided into a memory cell array region 1, a peripheral circuit region 2, and an STI region 3 as shown in FIG. 1B. The STI region 3 has a configuration in which insulating films 23 to 25 are embedded in a trench 11 formed on the semiconductor substrate 10. The insulating film 23 may include a silicon oxide, the insulating film 24 may include a silicon nitride, and the insulating film 25 may include a SOG (Spin-On-Glass) material. The STI region 3 extends in a y direction and is positioned between the memory cell array region 1 and the peripheral circuit region 2. Different trenches 12 and 13 are also formed on the semiconductor substrate 10. The trench 12 extends in an x direction over the memory cell array region 1 and the STI region 3. Although only one trench 12 is illustrated in a cross-section shown FIG. 1B, in practice a plurality of the trenches 12 extending in the x direction are arrayed in the y direction. A word line 31 is partially embedded in an associated one of the trenches 12. A top part of each of the word lines 31 is covered with an insulating film 32. An insulating film 21 including a silicon oxide is embedded in the inner parts of the trenches 13 and functions as a STI region for cell transistors. In the cross-section shown in FIG. 1B, the surface of the semiconductor substrate 10 in the peripheral circuit region 2 is covered with an insulating film 33. The insulating film 33 is a gate dielectric film of a transistor formed in the peripheral circuit region 2.

The trench 11 has inner walls 11a and 11b, and a bottom surface 11c. The inner wall 11a is positioned on a boundary between the memory cell array region 1 and the STI region 3. The inner wall 11b is positioned on a boundary between the peripheral circuit region 2 and the STI region 3. As shown in FIG. 1B, the inner walls 11a and 11b are in contact with the insulating film 23. Particularly the entire inner wall 11b positioned on the side of the peripheral circuit region 2 is covered with the insulating film 23 without being exposed.

A manufacturing method of the semiconductor device according to the present embodiment is explained next.

Figure 2A:
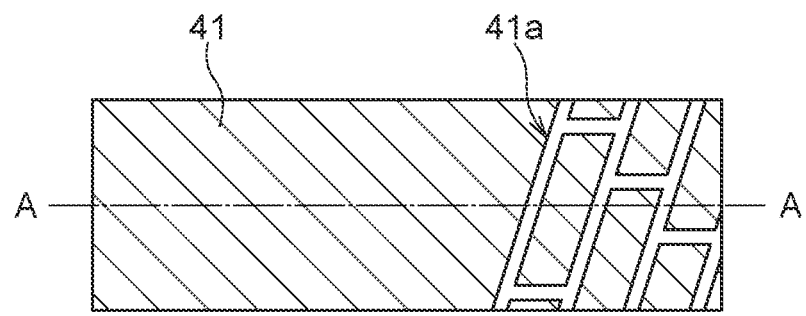
FIG. 2A is a partial schematic plan view for a manufacturing process of the semiconductor device according to the present disclosure.
Figure 2B:
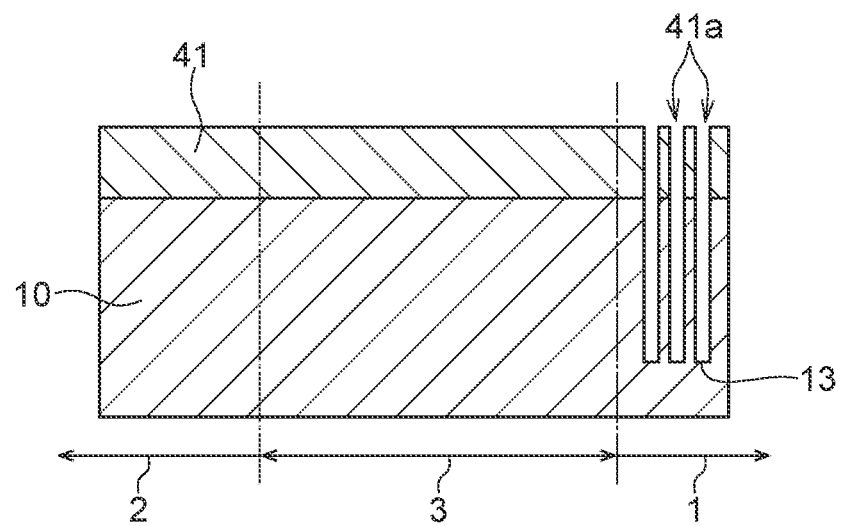
FIG. 2B is schematic cross-sections along a line A-A shown in FIG. 2A.
Figure 3A:
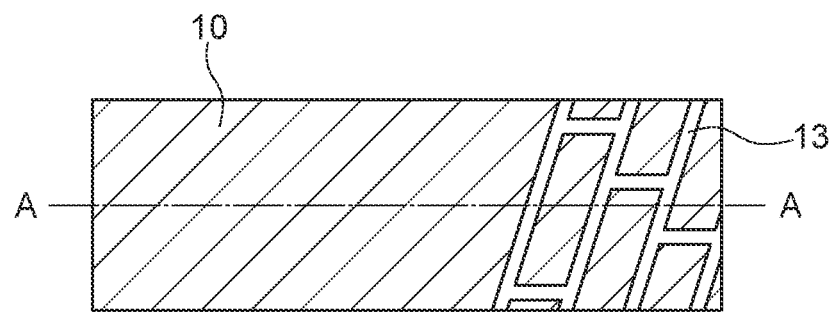
FIG. 3A is a partial schematic plan view for a manufacturing process of the semiconductor device according to the present disclosure.
Figure 3B:
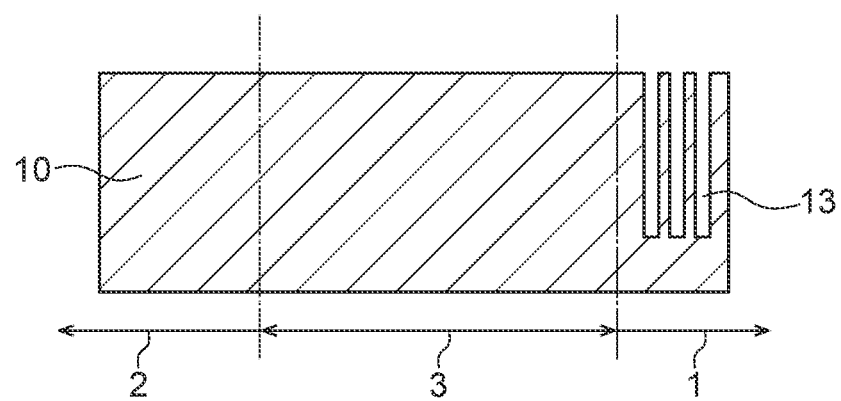
FIG. 3B is schematic cross-sections along a line A-A shown in FIG. 3A.
Figure 4A:
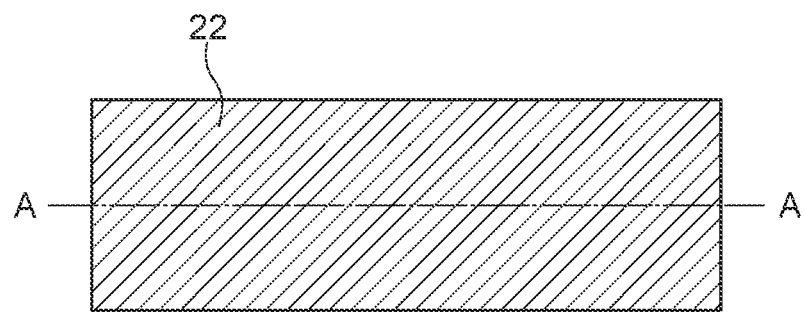
FIG. 4A is a partial schematic plan view for a manufacturing process of the semiconductor device according to the present disclosure.
Figure 4B:
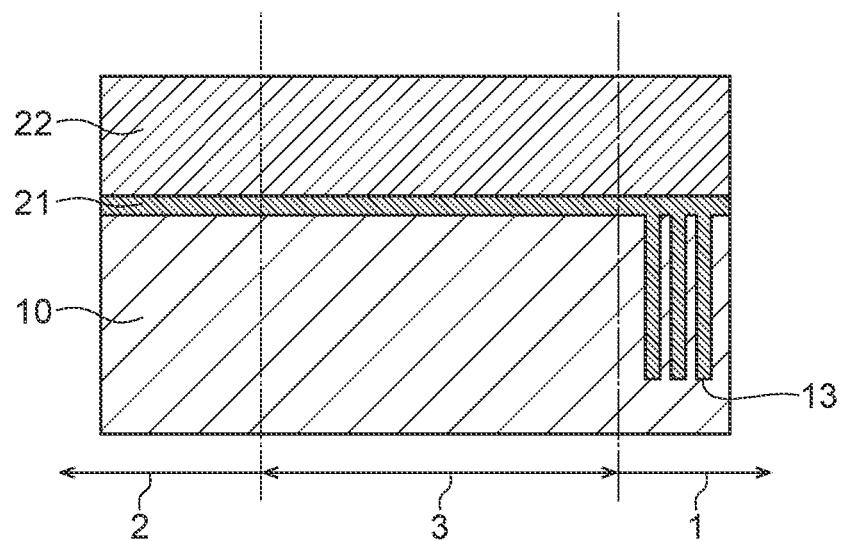
FIG. 4B is schematic cross-sections along a line A-A shown in FIG. 4A.

First, a hardmask 41 is formed on the semiconductor substrate 10 and the hardmask 41 is patterned to form openings 41a on the hardmask 41 as shown in FIGS. 2A and 2B. The semiconductor substrate 10 is then etched sing the hardmask 41 as a mask, thereby forming a plurality of trenches 13 in the memory cell array region 1. Next, after the hardmask 41 is removed as shown in FIGS. 3A and 3B, the insulating film 21 and an insulating film 22 are formed in this order on the surface of the semiconductor substrate 10 as shown in FIGS. 4A and 4B. The insulating films 21 and 22 include a silicon oxide and a silicon nitride, respectively; and can be deposited by a CVD (Chemical Vapor Deposition) method. The film thickness of the insulating film may be greater than that of the insulating film 21. The inner parts of the trenches 13 are thereby filled with the insulating film including a silicon oxide. Cell transistors of a DRAM are formed in regions separated by the trenches 13.

Figure 5A:
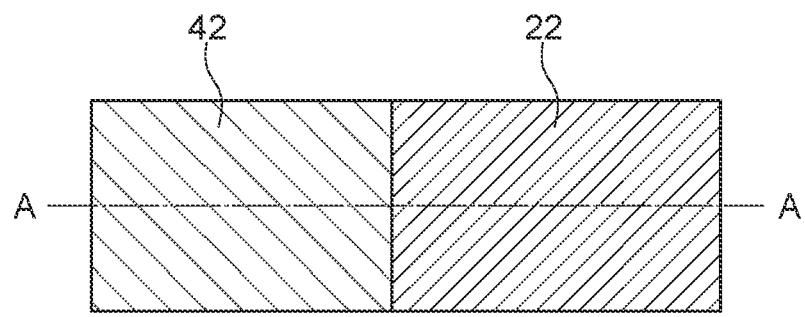
FIG. 5A is a partial schematic plan view for a manufacturing process of the semiconductor device according to the present disclosure.
Figure 5B:
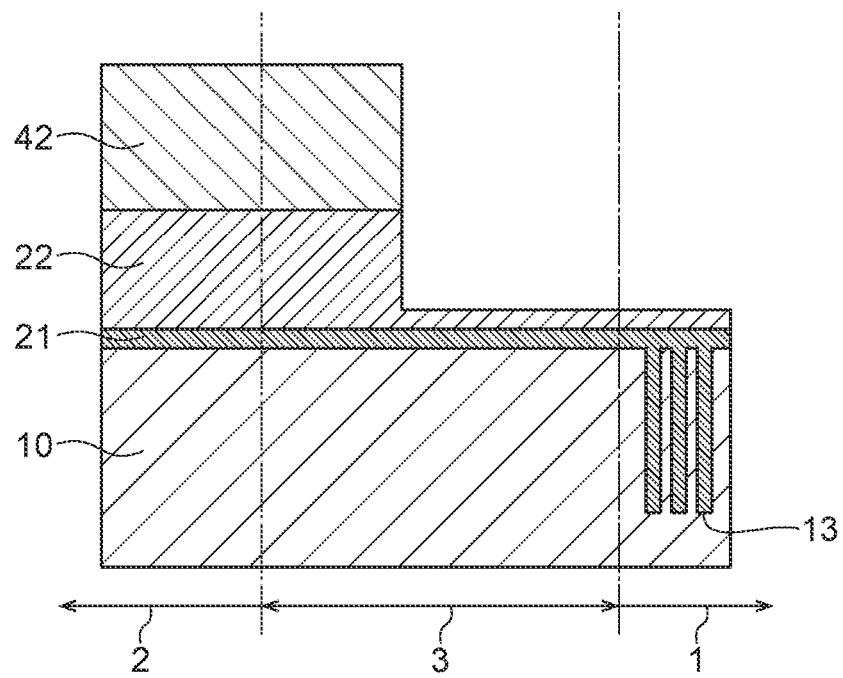
FIG. 5B is schematic cross-sections along a line A-A shown in FIG. 5A.
Figure 6A:
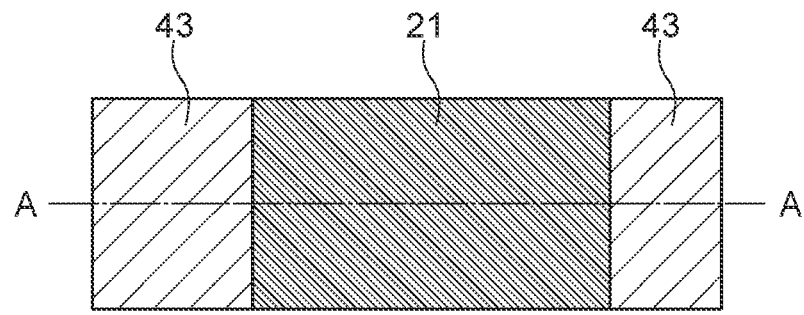
FIG. 6A is a partial schematic plan view for a manufacturing process of the semiconductor device according to the present disclosure.
Figure 6B:
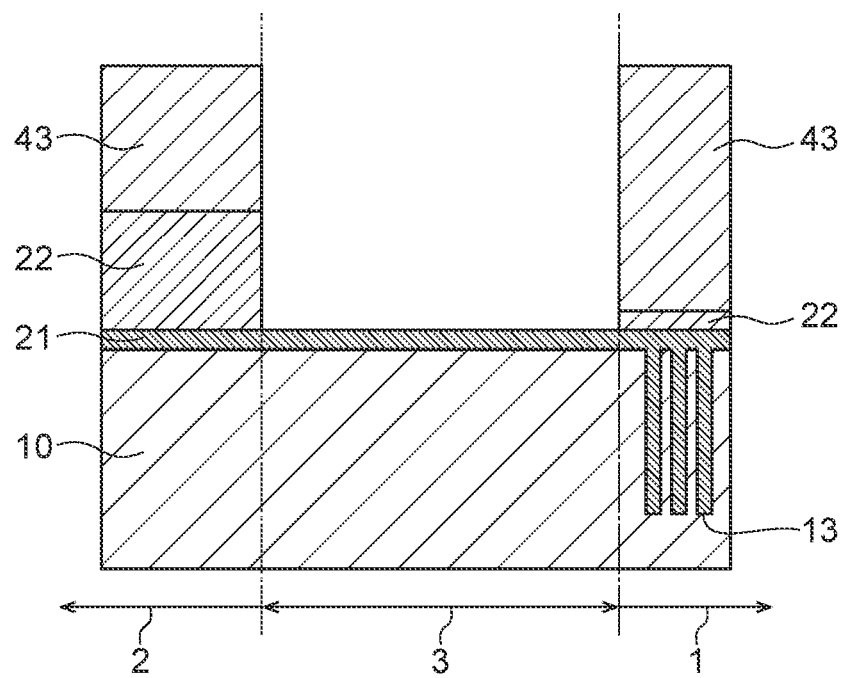
FIG. 6B is schematic cross-sections along a line A-A shown in FIG. 6A.
Figure 7A:
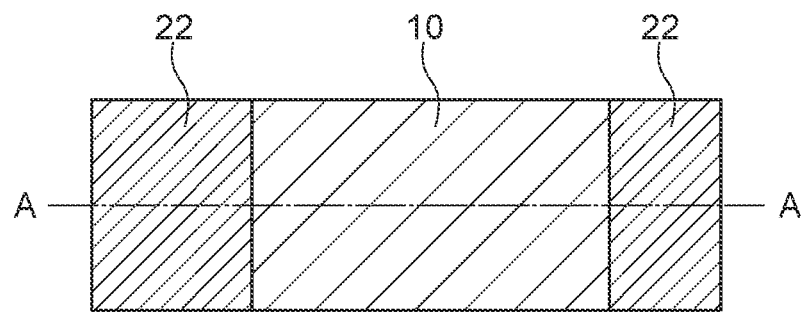
FIG. 7A is a partial schematic plan view for a manufacturing process of the semiconductor device according to the present disclosure.
Figure 7B:
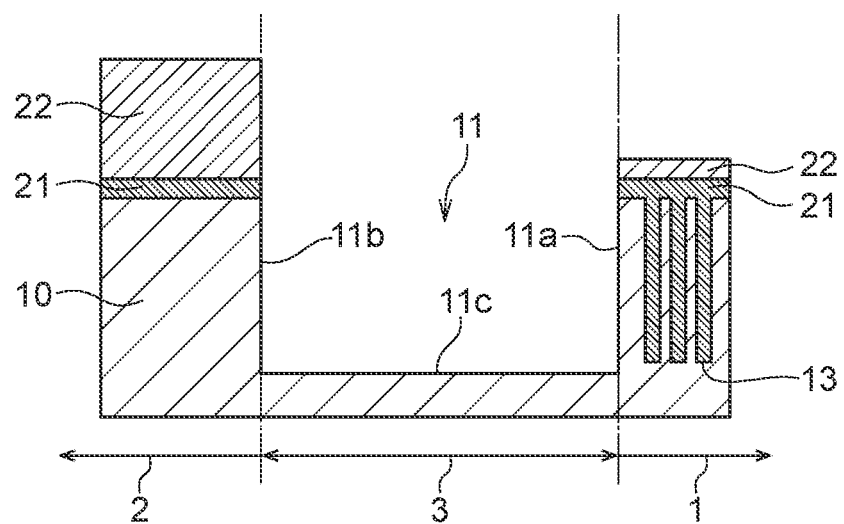
FIG. 7B is schematic cross-sections along a line A-A shown in FIG. 7A.
Figure 8A:
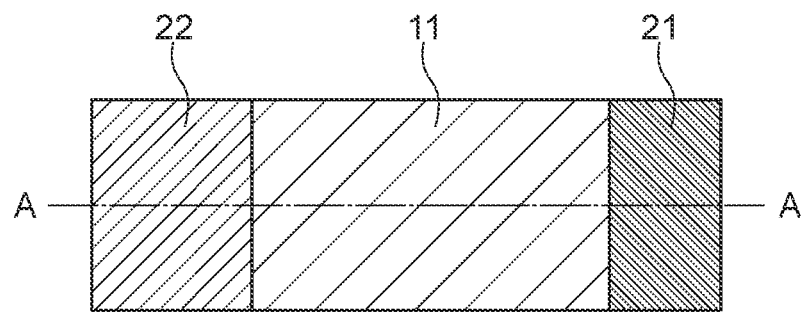
FIG. 8A is a partial schematic plan view for a manufacturing process of the semiconductor device according to the present disclosure.
Figure 8B:
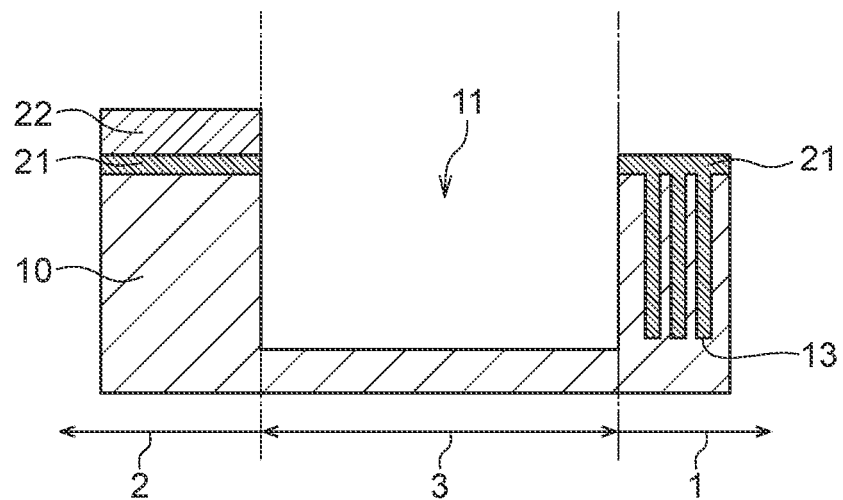
FIG. 8B is schematic cross-sections along a line A-A shown in FIG. 8A.

Next, as shown in FIGS. 5A and 5B, a portion of the insulating film 22 positioned in the peripheral circuit region 2 is covered with a resist 42 and the insulating film 22 is etched using the resist 42 as a mask, thereby decreasing the film thickness of a portion of the insulating film 22 positioned in the memory cell array region 1. Accordingly, the film thickness of the insulating film 22 on the memory cell array region 1 is smaller than that of the insulating film 22 on the peripheral circuit region 2. The edge of the resist 42 is positioned in the STI region 3 and a step is accordingly formed in the insulating film 22 on the STI region 3. Next, after the resist 42 is removed, another resist 43 covering the memory cell array region 1 and the peripheral circuit region 2 is formed as shown in FIGS. 6A and 6B. The insulating film 22 is then etched using the resist 43 as a mask, thereby removing a portion of the insulating film 22 covering the STI region 3 to expose the insulating film 21. Next, after the resist 43 is removed, the insulating film 21 and the semiconductor substrate 10 are etched using the insulating film 22 as a mask, thereby forming the trench 11 in the STI region 3 as shown FIGS. 7A and 7B. Accordingly, the inner wall 11a positioned on the side of the memory cell array region 1, the inner wall 11b positioned on the side of the peripheral circuit region 2, and the bottom surface 11c are exposed in the trench 11. Thereafter, the silicon nitride is wet-etched so as to remove the insulating film 22 on the memory cell a region 1. Accordingly, the insulating film 21 is exposed on the memory cell array region 1 as shown in FIGS. 8A and 8B. At this time, the condition of the wet etching is set to prevent the insulating film 22 on the peripheral circuit region 2 from being completely removed.

Figure 9A:
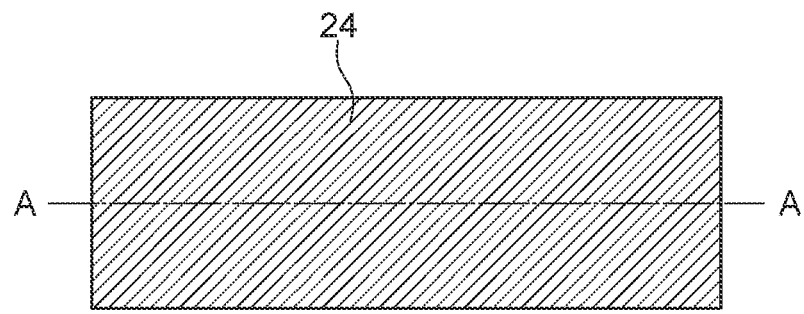
FIG. 9A is a partial schematic plan view for a manufacturing process of the semiconductor device according to the present disclosure.
Figure 9B:
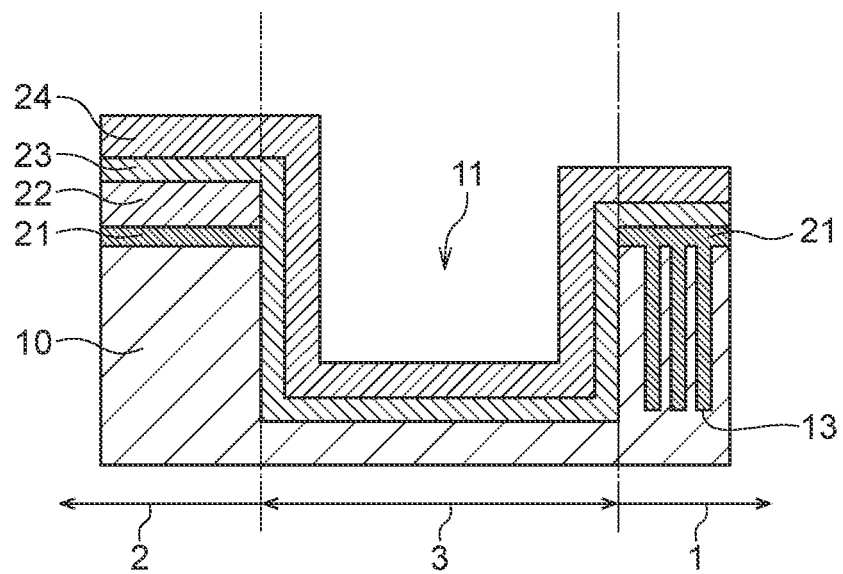
FIG. 9B is schematic cross-sections along a line A-A shown in FIG. 9A.
Figure 10A:
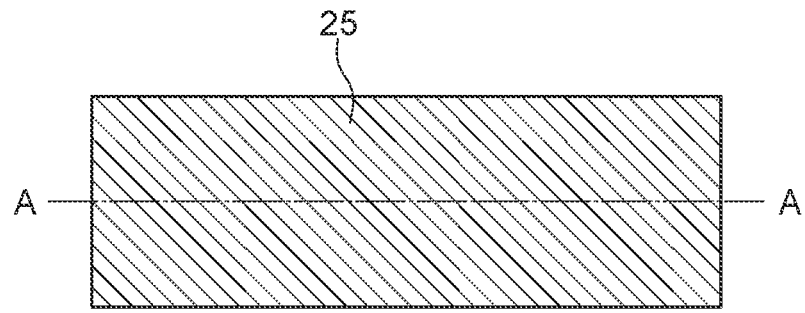
FIG. 10A is a partial schematic plan view for a manufacturing process of the semiconductor device according to the present disclosure.
Figure 10B:
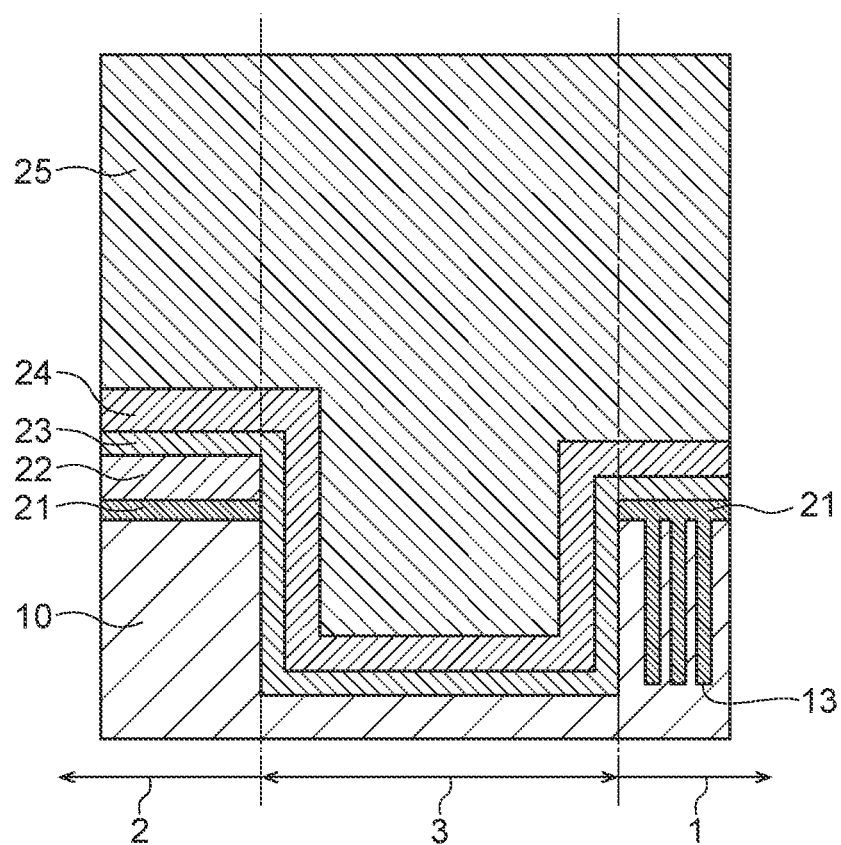
FIG. 10B is schematic cross-sections along a line A-A shown in FIG. 10A.
Figure 11A:
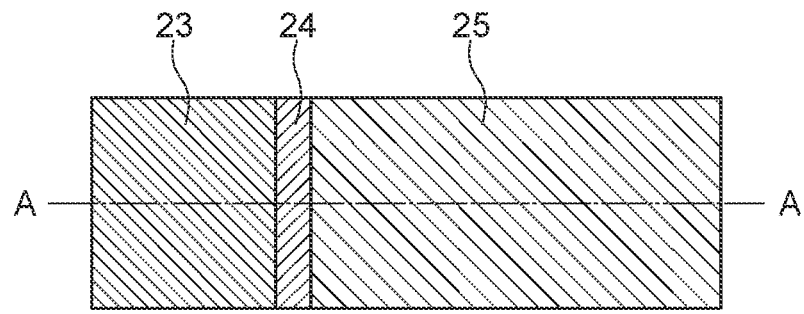
FIG. 11A is a partial schematic plan view for a manufacturing process of the semiconductor device according to the present disclosure.
Figure 11B:
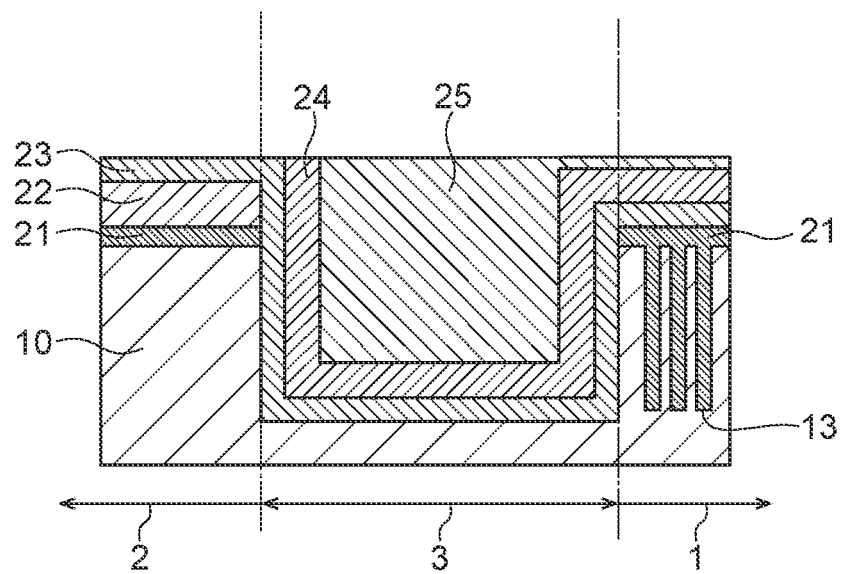
FIG. 11B is schematic cross-sections along a line A-A shown in FIG. 11A.

Next, the insulating films 23 and 24 are formed in this order all over the semiconductor substrate 10 as shown in FIGS. 9A and 913. The insulating films 23 and 24 include a silicon oxide and a silicon nitride, respectively, and can be deposited by the CVD method. The film thicknesses of the insulating films 23 and 24 are set to such thicknesses that do not completely fill the trench 11, Accordingly, the memory cell array region 1, the peripheral circuit region 2, and the inner walls of the trench 11 are covered with a stacked film including the insulating films 23 and 24. Since the insulating film 22 has been removed on the memory cell array region 1 at this time, the insulating film 23 and the insulating film 21 are directly stacked without the insulating film 22 interposed therebetween. In contrast thereto, since the insulating film 22 remains on the peripheral circuit region 2, the insulating film 21 and the insulating film 23 are stacked with the insulating film 22 interposed therebetween. Next, the insulating film 25 including a SOG material is formed all over the semiconductor substrate 10 as shown in FIGS. 10A and 10B. The thickness of the insulating film 25 is set to a sufficient thickness to fill the trench 11 with the insulating film 25. Next, the insulating film 25 is polished by a CMP (Chemical Mechanical Polishing) method to expose the insulating film 23 on the peripheral circuit region 2 as shown in FIGS. 11A and 11B. Specifically, after CMP is performed using the insulating film 24 including a silicon nitride on the peripheral circuit region 2 as a stopper, CMP is performed in a state where there is no selectivity between a silicon nitride and a silicon oxide, and the CMP is ended at a time when the insulating film 23 including a silicon oxide is exposed. Accordingly, a state in which the insulating film 24 is removed on the peripheral circuit region 2 and the insulating film 24 is left on the memory cell array region 1 is obtained.

Figure 12A:
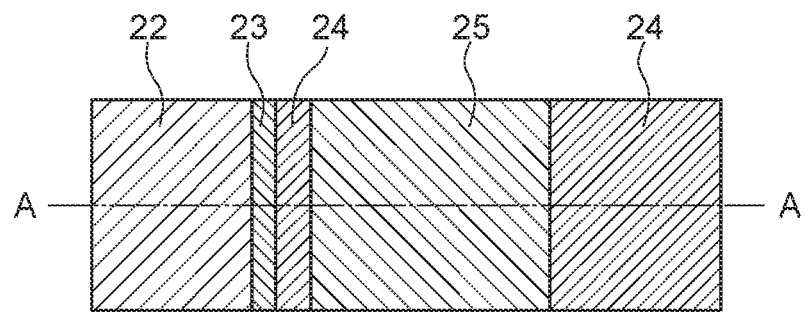
FIG. 12A is a partial schematic plan view for a manufacturing process of the semiconductor device according to the present disclosure.
Figure 12B:
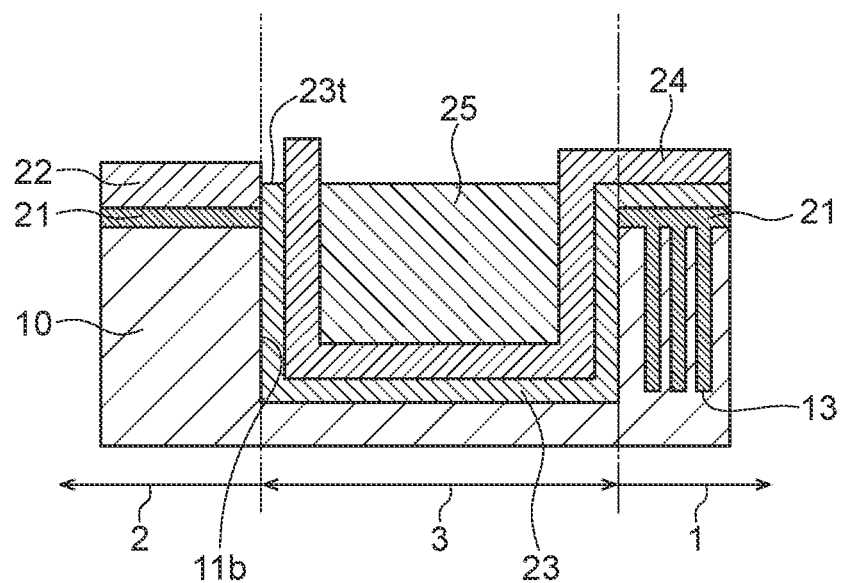
FIG. 12B is schematic cross-sections along a line A-A shown in FIG. 12A.
Figure 13A:
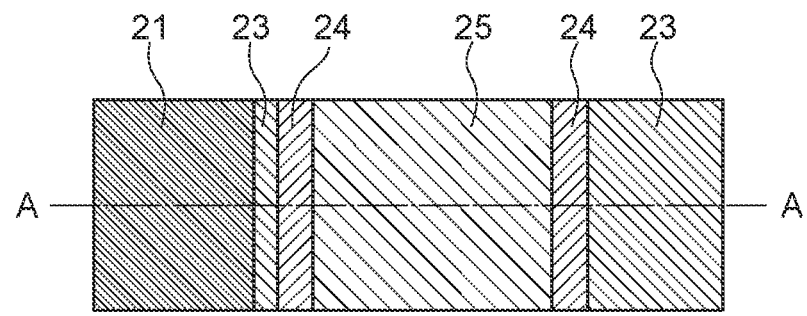
FIG. 13A is a partial schematic plan view for a manufacturing process of the semiconductor device according to the present disclosure.
Figure 13B:
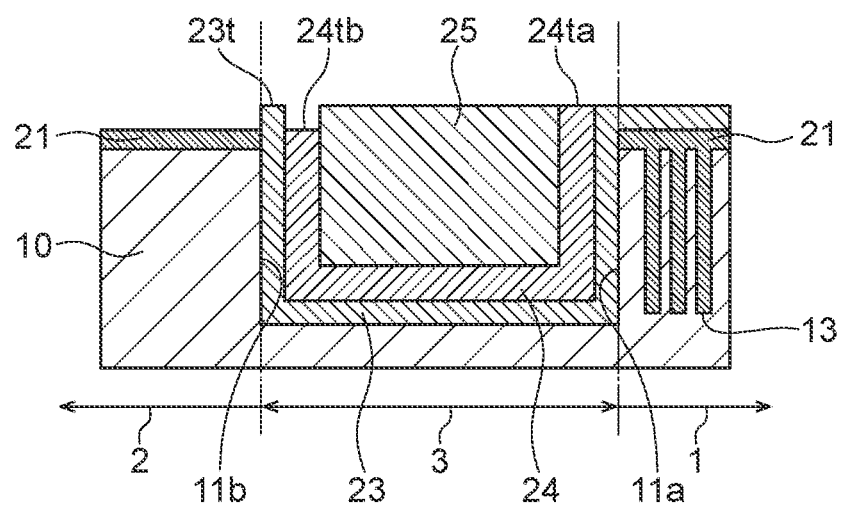
FIG. 13B is schematic cross-sections along a line A-A shown in FIG. 13A.

Next, dry etching is performed in a condition in which the etching rate to a silicon oxide is higher as shown in FIGS. 12A and 12B. This removes the insulating film 25 on the memory cell array region 1 to expose the insulating film 24 including a silicon nitride, and removes the insulating film 23 on the peripheral circuit region 2 to expose the insulating film 22 including a silicon nitride. At this time, the etching condition is set to cause a top surface 23t of the insulating film 23 covering the inner wall lib of the trench 11 to be higher than the upper surface of the insulating film 21. Next, thy etching is performed in a condition in which the etching rate to a silicon nitride is higher as shown in FIGS. 13A and 13B. This removes the insulating film 24 on the memory cell army region 1 to expose the insulating film 23 including a silicon oxide, and removes the insulating film 22 on the peripheral circuit region 2 to expose the insulating film 21 including a silicon oxide. As a result, the insulating film 23 covering the inner wall 11b of the trench 11 is brought to a state in which the top surface 23t is protruded from the surface of the insulating film 21. A top surface 24tb of a portion of the insulating film 24 covering the inner wall 11b is lower than a top surface 24ta of a portion thereof covering the inner wall 11a. The upper surface of the insulating film 23 on the memory cell array region 1 and the upper surface of the insulating film 25 on the STI region 3 are substantially in a same plane.

Figure 14A:
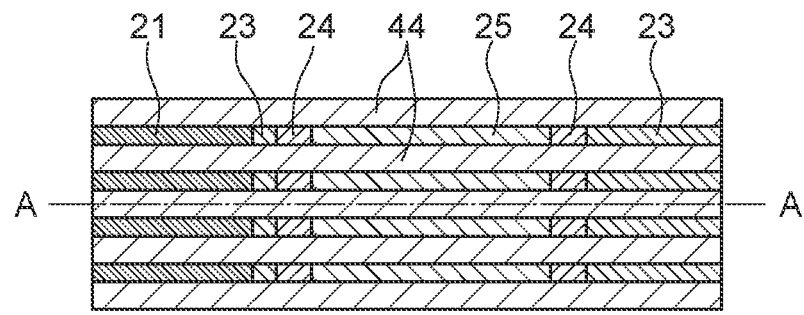
FIG. 14A is a partial schematic plan view for a manufacturing process of the semiconductor device according to the present disclosure.
Figure 14B:
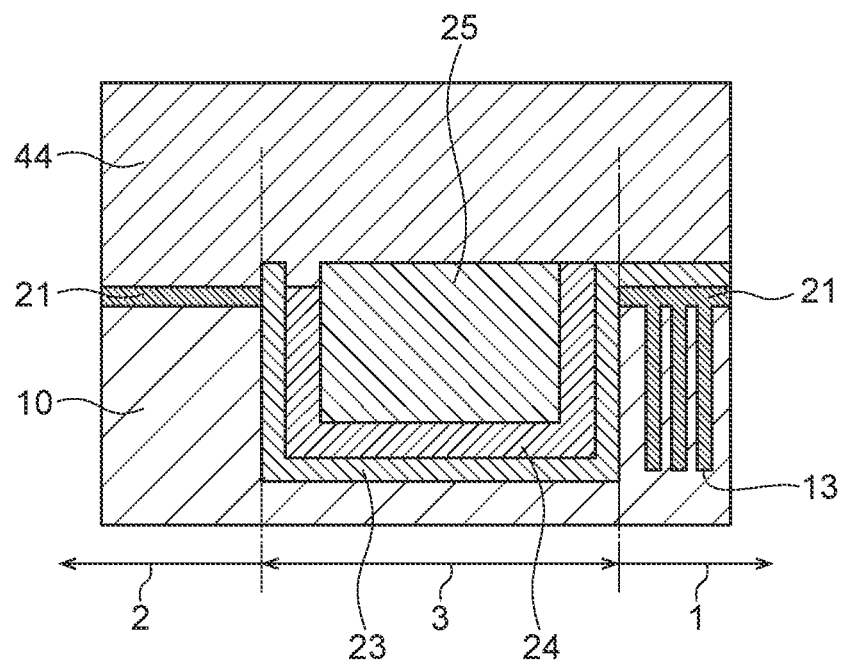
FIG. 14B is schematic cross-sections along a line A-A shown in FIG. 14A.
Figure 15A:
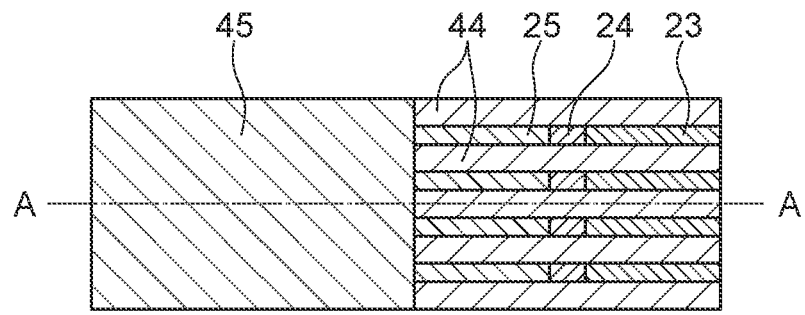
FIG. 15A is a partial schematic plan view for a manufacturing process of the semiconductor device according to the present disclosure.
Figure 15B:
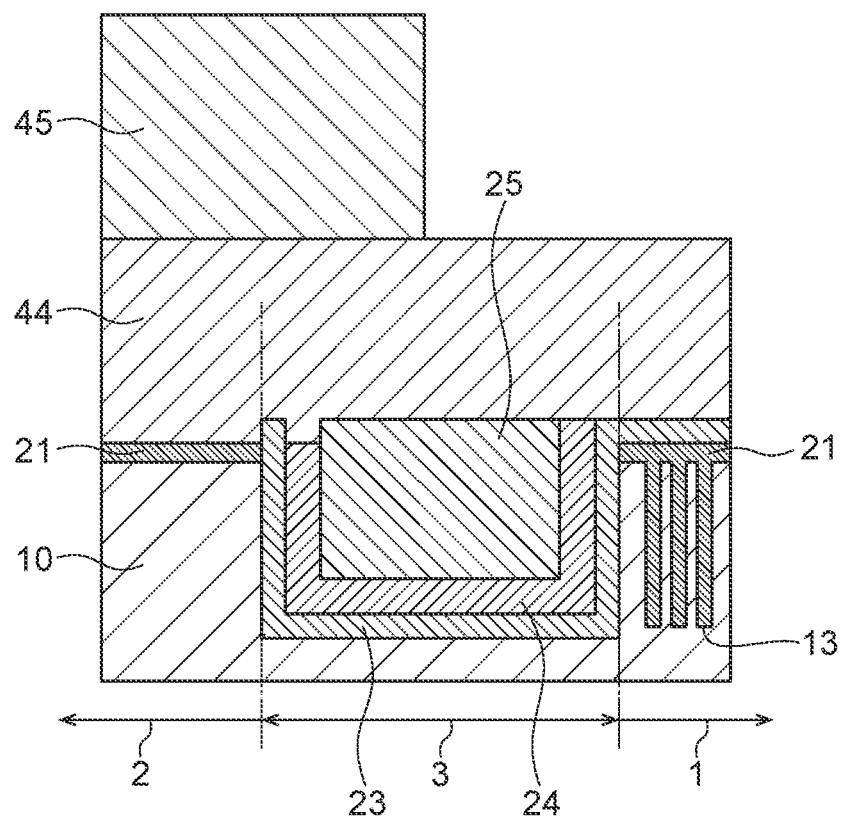
FIG. 15B is schematic cross-sections along a line A-A shown in FIG. 15A.
Figure 16A:
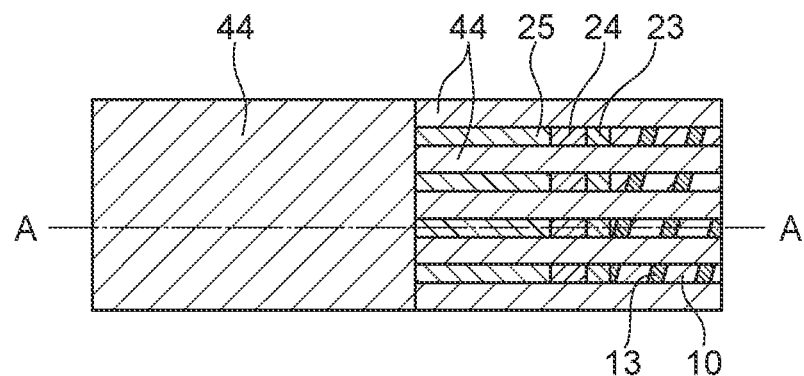
FIG. 16A is a partial schematic plan view for a manufacturing process of the semiconductor device according to the present disclosure.
Figure 16B:
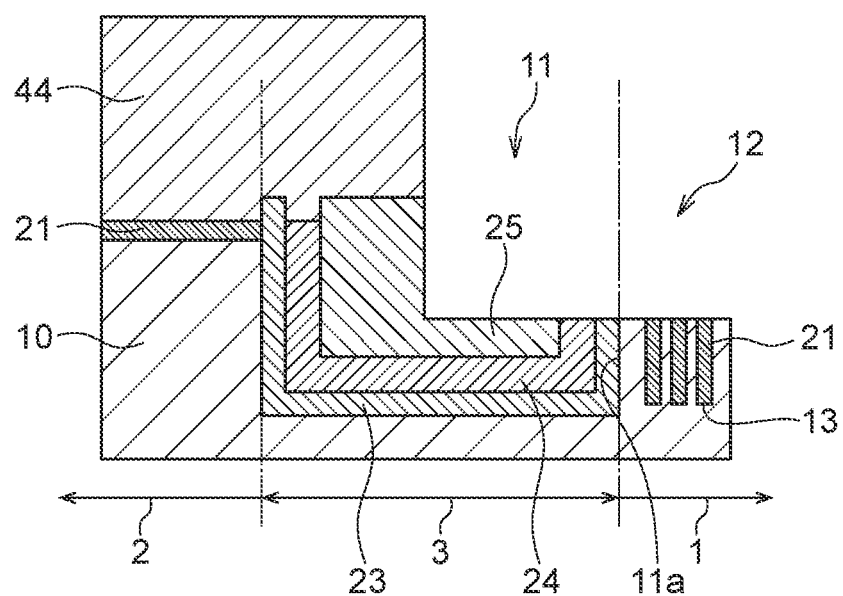
FIG. 16B is schematic cross-sections along a line A-A shown in FIG. 16A.

Next, after a hardmask 44 is formed all over the semiconductor substrate 10 as shown in FIGS. 14A and 14B, openings in the manner of stripes are formed on the hardmask 44. Next, the hardmask 44 formed on the peripheral circuit region 2 is covered with a resist 45 as shown in FIGS. 15A and 15B. The hardmask 44 formed on the memory cell array region 1 is in a state exposed without being covered with the resist 45. The edge of the resist 45 is positioned on the STI region 3. Next, after the resist 45 is removed, dry etching using the hardmask 44 as a mask is performed in this state, whereby a plurality of trenches 12 are formed in the memory cell array region 1 as shown FIGS. 16A and 16B, This dry etching is performed in a condition in which differences in the selectivity among silicon, a silicon oxide, and a silicon nitride are small. Therefore, the insulating films 21 and 23 including a silicon oxide and the insulating 24 including a silicon nitride are also etched, and the trenches 12 contact the trench 11 at the inner wall 11a. Since the upper surface of the insulating film 23 on the memory cell array region 1 and the upper surface of the insulating film 25 on the STI region 3 constitute substantially same planes at this time as shown in FIG. 13B, the widths of the trenches 12 formed in the memory cell array region 1 and the widths of the trenches 12 formed in the STI region 3 will be substantially uniform. That is, if there is a difference between the height of the upper surface of the insulating film 23 on the memory cell array region 1 and the height of the upper surface of the insulating film 25 on the STI region 3, the widths of the trenches 12 adversely change at a boundary portion between the memory cell array region 1 and the STI region 3. However, when the height of the upper surface of the insulating film 23 on the memory cell array region 1 and the height of the upper surface of the insulating film 25 on the STI region 3 are substantially equal, such a change in the widths of the trenches 12 can be prevented.

Figure 17A:
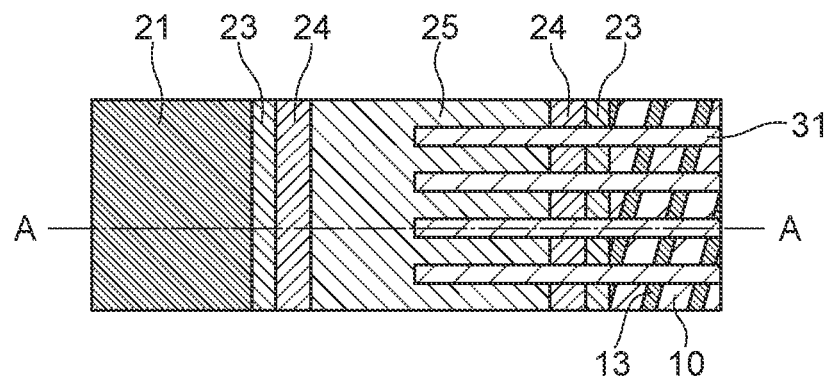
FIG. 17A is a partial schematic plan view for a manufacturing process of the semiconductor device according to the present disclosure.
Figure 17B:
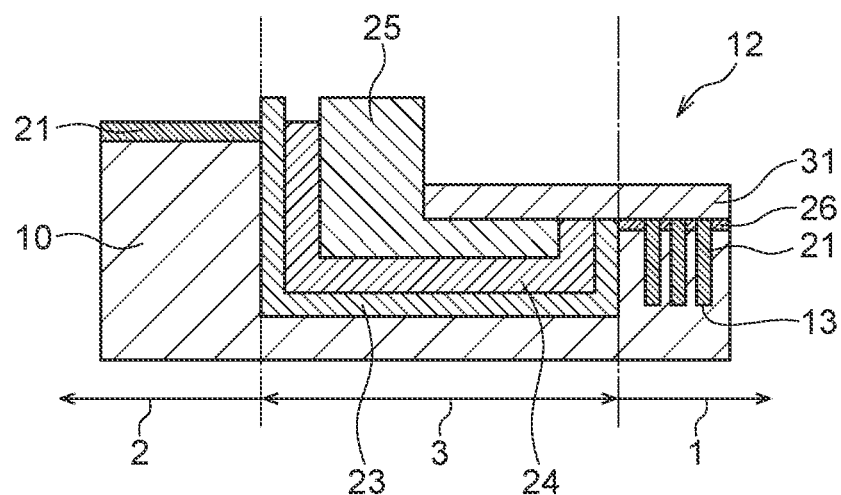
FIG. 17B is schematic cross-sections along a line A-A shown in FIG. 17A.
Figure 18A:
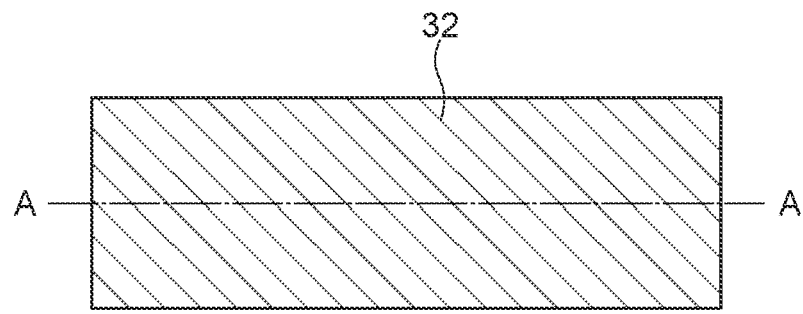
FIG. 18A is a partial schematic plan view for a manufacturing process of the semiconductor device according to the present disclosure.
Figure 18B:
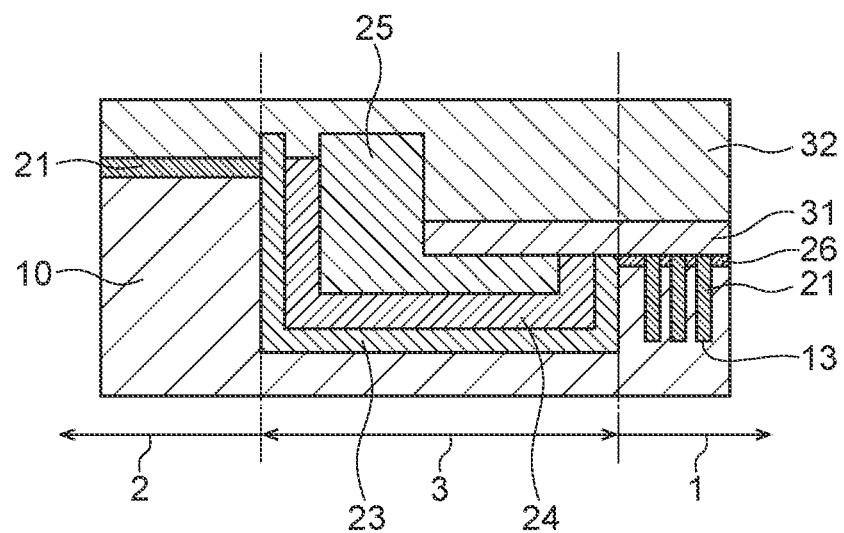
FIG. 18B is schematic cross-sections along a line A-A shown in FIG. 18A.
Figure 19A:
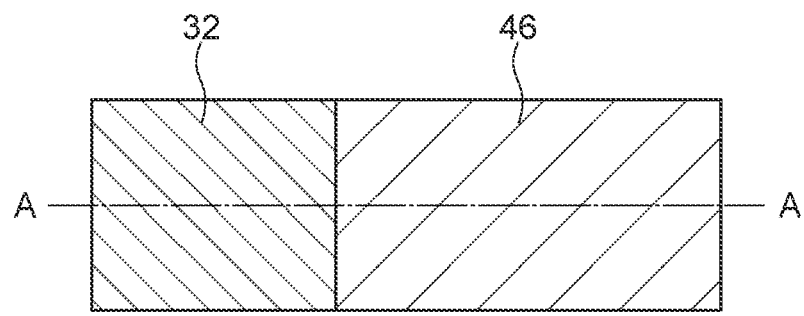
FIG. 19A is a partial schematic plan view for a manufacturing process of the semiconductor device according to the present disclosure.
Figure 19B:
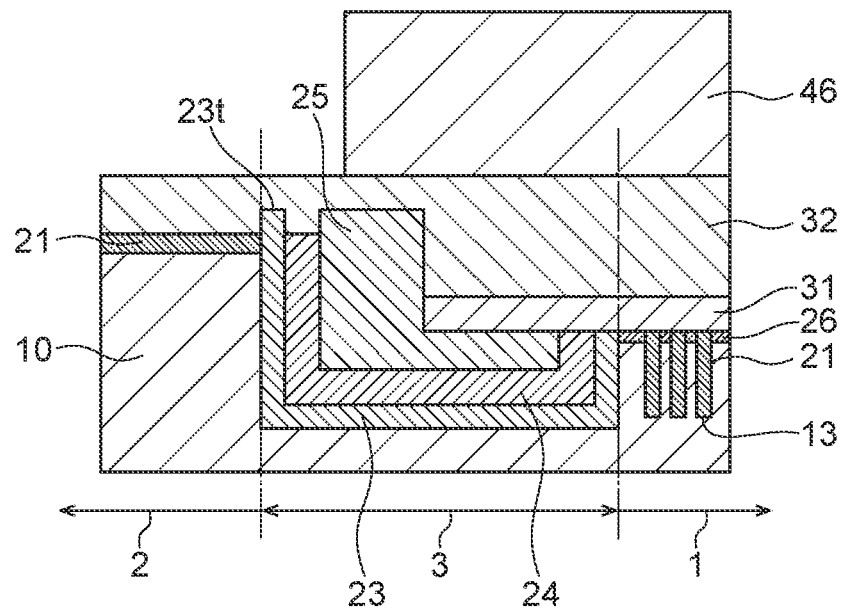
FIG. 19B is schematic cross-sections along a line A-A shown in FIG. 19A.
Figure 20A:
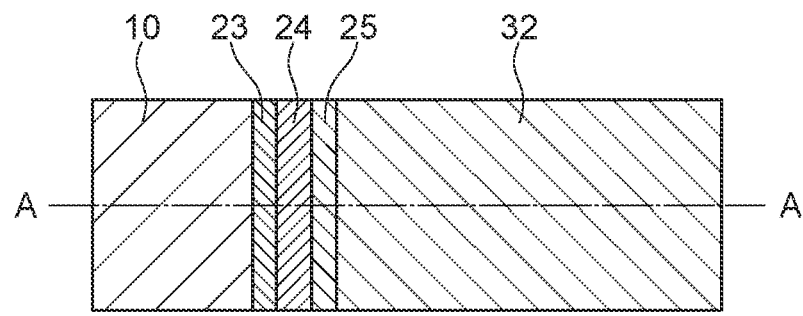
FIG. 20A is a partial schematic plan view for a manufacturing process of the semiconductor device according to the present disclosure.
Figure 20B:
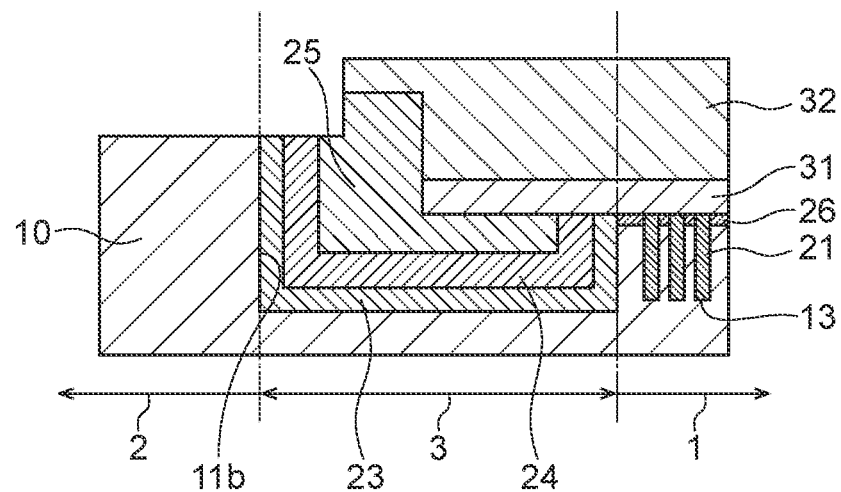
FIG. 20B is schematic cross-sections along a line A-A shown in FIG. 20A.

Next, after the hardmask 44 is removed as shown in FIGS. 17A and 17B, the semiconductor substrate 10 exposed on inner walls of the trenches 12 is thermally oxidized to form a silicon oxide film 26. This silicon oxide film 26 functions as gate electrodes of the cell transistors. The word line 31 is thereafter embedded in the trenches 12. Next, upper parts of the word lines 31 are covered with the insulating film 32 as shown in FIGS. 18A and 18B. Since the width of each of the trenches 12 is substantially uniform, breaking or the like of the word lines 31 due to a decrease in the widths of the trenches 12 relative to a design value does not occur. Next, the memory cell array region 1 is covered with a resist 46 as shown n FIGS. 19A and 19B. The peripheral circuit region 2 is in an exposed state without being covered with the resist 46. The edge of the resist 46 is positioned on the STI region 3. Next, etching is performed using the resist 46 as a mask, thereby removing the insulating films 21 and 32 formed on the peripheral circuit region 2 as shown in FIGS. 20A and 20B. Accordingly, the semiconductor substrate 10 is exposed in the peripheral circuit region 2. At this time, overetching needs to be performed so as to prevent the insulating film 21 from being left on the surface of the semiconductor substrate 10. However, since the insulating film 23 covering the inner wall 11b of the trench 11 is in a state in which the top surface 23t is protruded from the surface of the insulating film 21 in the present embodiment, the inner wall 11b of the french 11 is not exposed and can be kept covered with the insulating film 21 even when the overetching to remove the insulating film 21 is performed.

Thereafter, when thermal oxidation processing is performed, the semiconductor substrate 10 exposed in the peripheral circuit region 2 is oxidated and the insulating film 33 is formed as shown in FIGS. 1A and 1B. Thereafter, a wiring pattern and the like are formed. Since the inner wall 11b of the trench 11 is not exposed and is kept covered with the insulating film 21 as described above, a metallic material constituting the wiring pattern and the like are not accumulated on the inner wall 11b of the trench 11.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a semiconductor substrate having a first trench formed between a memory cell array region on which a plurality of memory cells are formed and a peripheral circuit region on which a peripheral circuit is formed; and
   a first insulating film covering an inner wall and a bottom surface of the first trench, wherein the peripheral circuit region is free from the first insulating film,
   wherein the inner wall includes a first inner wall positioned on a boundary between the memory cell array region and the first trench and a second inner wall positioned on a boundary between the peripheral circuit region and the first trench, and
   wherein the first insulating film continuously covers the second inner wall, the bottom surface, the first inner wall, and the memory cell array region.

2. The apparatus of claim 1, further comprising a second insulating film formed in the first trench so as to cover the first and second inner walls and the bottom surface of the first trench such that the first insulating film is located between the second insulating film and the first and second inner walls and the bottom surface of the first trench.

3. The apparatus of claim 2,
   wherein the first insulating film comprises a silicon oxide, and
   wherein the second insulating film comprises a silicon nitride.

4. The apparatus of claim 3,
   wherein the second insulating film includes a first section covering the first inner wall and a second section covering the second inner wall, and
   wherein a top end of the second section of the second insulating film is positioned lower than a top end of the first section of the second insulating film.

5. The apparatus of claim 4, further comprising a plurality of signal lines, wherein the semiconductor substrate further has a plurality of second trenches extending over the memory cell array region and the first trench, and wherein each of the signal lines is at least partially embedded in an associated one of the second trenches.

6. The apparatus of claim 5, wherein the signal lines are word lines to access the memory cells.

7. The apparatus of claim 5, wherein a top of part of each of the signal lines is covered with a third insulating film, and wherein the peripheral circuit region is covered with a fourth insulating film.

8. The apparatus of claim 1, wherein the first inner wall of the first trench is in direct contact with the memory cell array region, and wherein the second inner wall of the first trench is in direct contact with the peripheral circuit region.

9. The apparatus of claim 1, wherein a top surface of the first insulating film covering the second inner wall is higher than a top surface of the first insulating film covering the first inner wall.

* * * * *